United States Patent [19]
Hewitt

[11] Patent Number: 5,761,434
[45] Date of Patent: Jun. 2, 1998

[54] DIGITAL AUDIO SYSTEM INCLUDING A SOFTWARE CONTROLLED PHASE LOCK LOOP FOR SYNCHRONIZING AUDIO SOURCES TO A COMMON CLOCK SOURCE

[75] Inventor: Larry Hewitt, Austin, Tex.

[73] Assignee: Advanced Micro Devices, Inc., Sunnyvale, Calif.

[21] Appl. No.: 812,217

[22] Filed: Mar. 6, 1997

[51] Int. Cl.⁶ .................................................. H04N 1/36
[52] U.S. Cl. ........................ 395/200.61; 364/400.01
[58] Field of Search .................. 364/400.01; 395/427, 395/200.63, 287, 294, 296, 481, 485, 497.02, 200.61, 200.66, 200.68

[56] References Cited

U.S. PATENT DOCUMENTS 5,612,939 3/1997 Ueki et al. .................................. 369/48
5,666,460 9/1997 Ohta et al. .................................. 386/82

*Primary Examiner*—Thomas Peeso
*Attorney, Agent, or Firm*—Conley, Rose & Tayon; Jeffrey C. Hood; Dan J. Krueger

[57] ABSTRACT

A system and method for software control of a phase lock loop which accomplishes synchronization between sampled input audio voice signals and a clock controlling the output signal sampling rate. A memory queue is used to buffer input voice data sampled at an input sampling rate. A DSP retrieves stored voice data from the memory queue at a read rate which is periodically adjusted by the DSP according to the number of stored voice data samples remaining in the queue. The read rate is adjusted so as to maintain the number of stored voice data samples at substantially half of the queue capacity.

15 Claims, 4 Drawing Sheets

| TIME ELAPSED (SECONDS) | $F_c$ AFTER INTERRUPT | $F_c$ ERROR | NUMBER OF STORED SAMPLES |
|---|---|---|---|
| 0 | 1.00000 | -0.00080 | 128 |
| 1 | 1.00100 | 0.00020 | 93 |
| 2 | 1.00100 | 0.00020 | 102 |
| 3 | 1.00100 | 0.00020 | 110 |
| 4 | 1.00100 | 0.00020 | 119 |
| 5 | 1.00100 | 0.00020 | 128 |
| 6 | 1.00100 | 0.00020 | 137 |
| 7 | 1.00075 | -0.00005 | 145 |
| 8 | 1.00075 | -0.00005 | 143 |
| 9 | 1.00075 | -0.00005 | 141 |

FIG. 6

DIGITAL AUDIO SYSTEM INCLUDING A SOFTWARE CONTROLLED PHASE LOCK LOOP FOR SYNCHRONIZING AUDIO SOURCES TO A COMMON CLOCK SOURCE

BACKGROUND OF THE INVENTION

1. Field of the Invention

This invention is related to the field of computer system digital audio. More particularly, the current invention relates to a system and method for software control of a phase-lock loop which reduces the drift between audio sources operating at different clock rates.

2. Description of the Related Art

The current generation of personal computers (PCs) typically have a system audio device which provides sound capabilities to the PC. One of the many functions of the system audio device is to convert various sources of analog and digital information into a single output signal (typically a stereo output signal) to be sent to speakers or headphones. The system audio device converts multiple digital signals, called voices, stored in a memory into a single digital result. (The single digital result may actually be comprised of two audio samples, e.g. in the case of stereo output, or more in other audio-output situations.) These voices may be sampled at different rates. This means that the number of samples per unit time varies from voice to voice. The system audio device converts each of these voices to a single fixed output sample rate, and subsequently mixes them together. The result is converted to the analog domain to be amplified and sent to the speakers (or headphones). The sample rate conversion is normally accomplished by setting Fc, which is defined to be the ratio of the input sample rate for a voice to the output sample rate. The system audio device operates from a local oscillator which determines the output sample rate, and the sample rate conversion is accomplished by oversampling by a fixed ratio determined by Fc.

A Digital Signal Processor (DSP) performs the sample rate conversion using one of various well-known re-sampling techniques. A simple example of one re-sampling technique uses linear interpolation. If Fc is 0.9, then the output sampling period is 0.9 times the input sampling period. The first output sample might then be equal to the first input sample. The second output sample would then be 0.9 of the second input sample plus 0.1 of the first input sample. The third output sample would be 0.8 of the third input sample plus 0.2 of the second input sample. Continuing in this manner provides 10 output samples for every 9 input samples. Other interpolation methods exist and are typically used for their higher noise immunity.

The number of simultaneous active voices that a system audio device can have is referred to as the polyphony of the audio device. A system audio device operates as a Digital Signal Processor (DSP) system, and as such has an associated sample rate hereinafter called the frame rate, which is assumed to be 44,100 frames per second. During each frame time, which is the reciprocal of the frame rate (22.7 microseconds at a frame rate of 44,100 frames per second), the DSP must calculate a new output value for each of the active voices (up to 32 in our example). Assuming the polyphony is 32, this implies that the DSP hardware must process up to 44,100×32=1,411,200 voice outputs per second. The data samples are typically one byte or two bytes wide.

It would be desirable to extend the function of a system audio device to add voices which are brought into the system audio device through a separate, real-time port. The added voices may use a sample rate that is the same as the output rate, or they may use a sample rate that is different. In either case, the added voices are synchronized to a different clock source than the clock on the system audio device. Even when the sample rates are the same as the output rate, drift between the two clocks may cause samples to be dropped or repeated occasionally, resulting in audible distortions.

SUMMARY OF THE INVENTION

The present invention comprises a system and method for software control of a phase lock loop which accomplishes synchronization between sampled input audio voice signals and a clock controlling the output signal sampling rate. The present invention is preferably comprised in a computer digital audio system. The audio system includes a port which receives an audio signal. The audio signal received on the port is synchronized to a different clock source than the clock in the audio system.

In the preferred embodiment, a memory queue is used to buffer input voice data sampled at an input sampling rate, and a DSP retrieves stored voice data from the memory queue. In order to perform the synchronization, the DSP retrieves the stored voice data at a read rate which is periodically adjusted by the DSP according to the number of stored voice data samples remaining in the queue. The read rate is adjusted to maintain the number of stored voice data samples at substantially half of the queue capacity. This operates to synchronize the received audio signal to the audio system clock signal. In one embodiment, the system implements the queue by using system memory to store the input voice data.

In a preferred embodiment, each input voice has an associated memory queue with a write pointer, a read pointer, and a sample rate conversion ratio. As data is written into the queue, the write pointer advances away from the read pointer. As data is read from the queue, the read pointer advances toward the write pointer. The number of samples in the queue is calculated by calculating the distance between the read and write pointers. Adjustments to the sample rate conversion ratio are made to maintain the number of samples in the queue near a predetermined optimum level.

BRIEF DESCRIPTION OF THE DRAWINGS

Other objects and advantages of the invention will become apparent upon reading the following detailed description and upon reference to the accompanying drawings in which:

FIG. 6 is a table illustrating the phase-lock behavior of a DSP executing the flowchart in FIG. 5.

Figure 1:
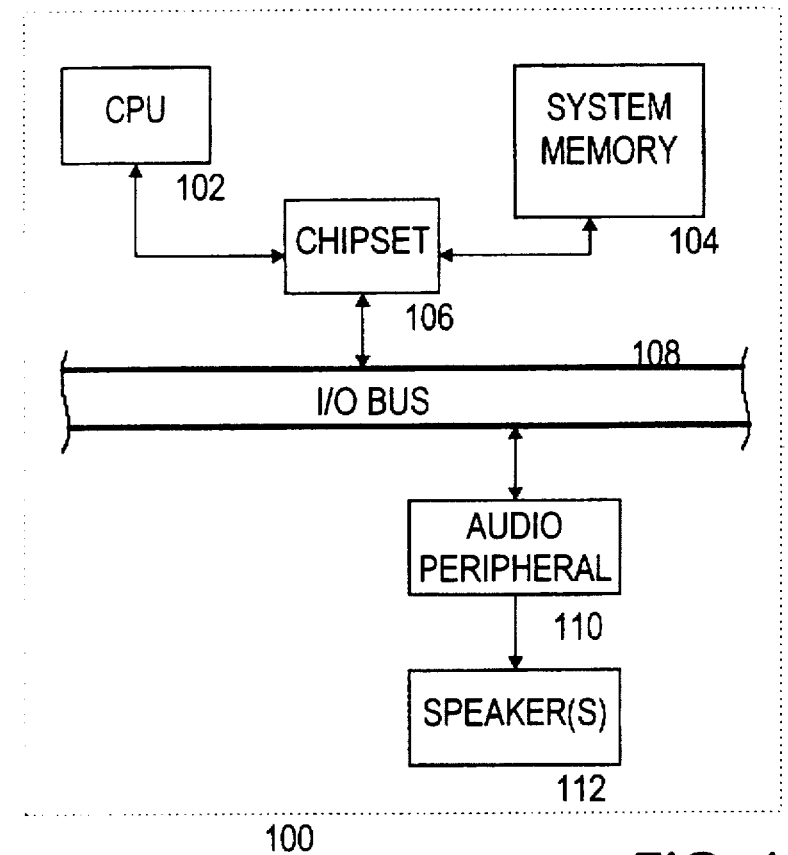
FIG. 1 is a block diagram of a computer system having a system audio device which includes the capability of mixing audio voices which enter the system in a real-time fashion.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Turning now to FIG. 1, one embodiment of a computer system 100 according to the present invention is shown. The computer system 100 includes a CPU 102, a system memory 104, a chipset 106, and a system audio device 110. Chipset 106 and audio device 110 are coupled to an I/O bus 108. Audio device 110 generates sound through an analog device 112 such as speakers or headphones. Real time voice sample data from an external, asynchronously clocked source is brought into computer system 100 by a real-time port (not shown) such as a serial port, and stored in a queue in memory. In one embodiment discussed further below, the memory used is local memory contained in system audio device 110. In another embodiment of the present invention, the system memory 104 is used to store the voice sample data. The audio device 110 subsequently retrieves and mixes the voice sample data contained in memory to create a single audio output signal. For more information on an audio system which uses system memory to store audio data, please see U.S. Pat. application Ser. No. 08/623,850 filed Mar. 25, 1996 titled "Computer System and Method for Generating Delay-based Audio Effects in a Wavetable Music Synthesizer Which Stores Wavetable Data in System Memory," whose inventor is Dale Gulik, which is hereby incorporated by reference as though fully and completely set forth herein.

Figure 2:
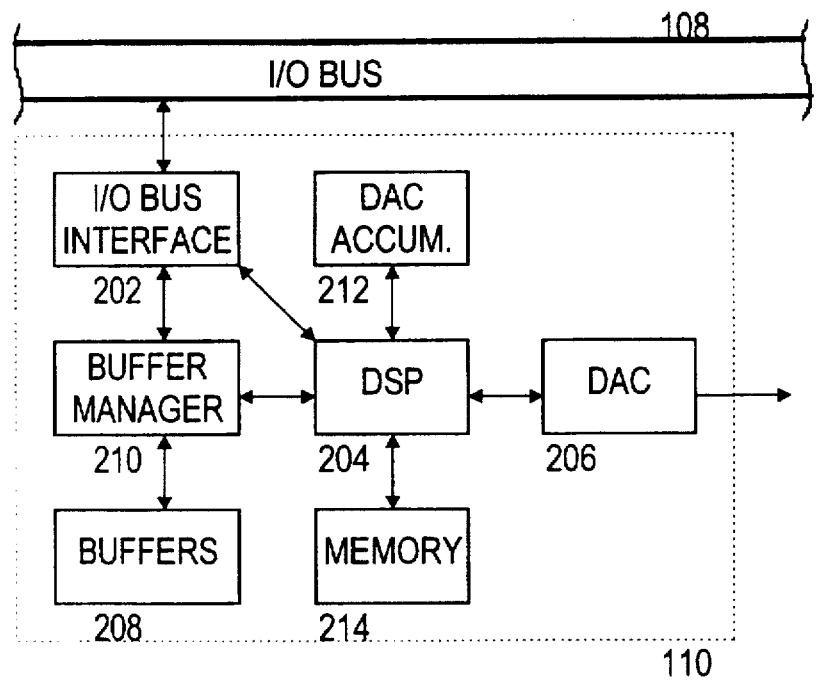
FIG. 2 is a block diagram of the system audio device of FIG. 1.

Turning now to FIG. 2, a block diagram of the preferred embodiment of system audio device 110 of FIG. 2 is shown. System audio device 110 includes an I/O bus interface 202, a DSP 204, a digital-to-analog converter (DAC) 206, a plurality of buffers 208 and a buffer manager 210. Additionally, DSP 204 can access a DAC accumulator 212. In one embodiment, a local memory 214 is coupled to DSP 204, and is used for storing voice data. This option, though somewhat more expensive than using system memory 104 to store the voice data, may be chosen to improve system efficiency by avoiding bus overhead. In the preferred embodiment, system memory 104 is used to store voice data.

Typically, DSP 204 generates requests for samples sequentially. Data samples for a given voice are stored sequentially in system memory 104. Consequently, buffer manager 210 advantageously prefetches voice data samples for active voices into buffers 208 in anticipation of sequential requests from DSP 204. In other words, buffer manager 210 fills buffers 208 in a predetermined fashion in order to avoid I/O bus latencies associated with fetching the samples. In the preferred embodiment, the depth of each of buffers 208 is 16 and buffer manager 210 prefetches the number of samples of data required to fill the buffers for each delay element when the first buffer uses its eighth sample; i.e. when only 8 samples remain in the respective buffer. If DSP 204 does not receive the requested data sample before it is needed, DSP 204 outputs a surrogate value to DAC 206 until the new data sample becomes available. Hence, buffers 208 minimize the impact of conditions where I/O bus latencies are large.

I/O bus interface 202 arbitrates for, gains mastership of, and fetches voice data samples across I/O bus 108 into buffers 208 in response to requests from buffer manager 210. In the preferred embodiment buffer manager 210 attempts to fill buffers 108 for all active voices in a given I/O bus 108 mastership, and thus minimizes the number of I/O bus 108 mastership requests per second and improves overall system performance. Accordingly, as can readily be observed, the greater the number of samples which can be prefetched into buffers 208 the fewer the number of I/O bus 108 mastership requests per second which audio device 110 must make. However, it should be noted that increasing the depth of buffers 208 increases the die size of the integrated circuit embodying audio device 110 and thus increases its cost.

When buffer manager 210 receives a request for voice data samples from DSP 204 it determines whether the requested samples reside in buffers 208. If so, buffer manager 210 passes the requested samples from buffers 208 to DSP 204. If buffer manager 210 determines that the samples requested by DSP 204 do not reside in buffers 208, buffer manager 210 obtains the voice data from the system memory 104. In one embodiment, buffer manager 210 generates a high priority fill request to obtain mastership of I/O bus 108. Once I/O bus interface 202 obtains mastership of I/O bus 108 buffer manager 210 fills the buffer in buffers 208 corresponding to the voices associated with the request with voice data samples from system memory. These samples are specified by address signals which are passed to I/O bus 108 by I/O bus interface 202. The samples are transferred from system memory on I/O bus 108, through I/O bus interface 202, and routed by buffer manager 210 into buffers 208.

In the event that I/O bus interface 202 is unable to obtain mastership of I/O bus 108 within a desired frame time latency, buffer manager 210 asserts data unavailable signal to notify DSP 204 that the requested voice data sample was unavailable. If DSP 204 does not receive the requested data sample within the desired frame time the DSP outputs a surrogate value until the new data sample becomes available.

Therefore, buffer manager 210 operates to obtain voice data samples from the system memory 104. For more information on an audio system which uses high priority and normal priority data requests please see the U.S. patent application Ser. No. 08/623,850 referenced above.

Figure 3:
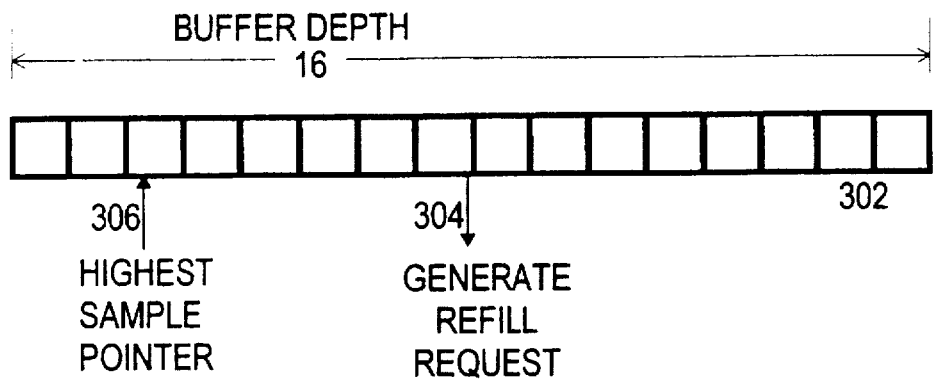
FIG. 3 is a schematic diagram of a read buffer configuration which may be used for read caching of system memory data.

Turning now to FIG. 3, an illustration of a buffer 302 is shown. Buffer 302 is exemplary of plurality of buffers 208 in FIG. 2. In the embodiment shown, buffer 302 has a depth of 16, i.e., has 16 sample locations. Buffer manager 210 maintains a highest sample pointer 306 which points to the next available sample in buffer 302. Each time buffer 302 passes a new (higher numbered) sample to DSP 204, buffer manager 210 updates highest sample pointer 306 to point to the next available sample. When highest sample pointer 306 points to a predetermined generate fill request location 304, buffer manager 210 asserts the normal fill request signal. In the preferred embodiment, generate fill request location 304 is where 8 samples remain in buffer 302. It is noted that various depths of buffer 302 and generate fill request location 304 may be realized and in describing the embodiment shown it is not the intention to preclude any such other variations.

Figure 4:
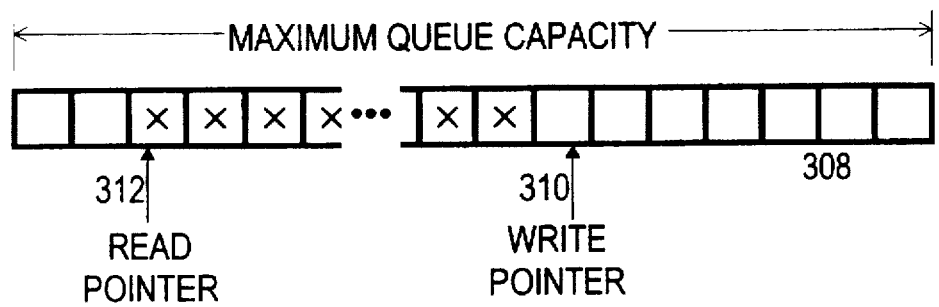
FIG. 4 is a schematic diagram of a queue configuration which is used for FIFO buffering of real-time input data, and which is used to maintain synchronization of a received audio signal to a new clock source according to the preferred embodiment.

Thus far an architecture has been discussed for a system audio device which retrieves voice data samples which have been stored in memory. At least one of the voices is in the form of real-time voice data samples from an asynchronously clocked source which have been brought into the system by a separate real-time port. As they are received by the system, the asynchronous voice data samples are stored in queues (one queue per asynchronous voice) in either system memory 104 or in local memory 214. As shown in FIG. 4, each queue 308 has a maximum queue capacity, a write pointer 310, and a read pointer 312. Asynchronous voice data samples are written to the queue location indicated by write pointer 310, and write pointer 310 is advanced once for each written data sample. The write pointer "wraps around" to the first queue location when advanced past the last queue location. Similarly, stored asynchronous data samples are read from the queue location indicated by read pointer 312, and read pointer 312 is advanced once for every data sample read. Consequently, queue 308 has a number of unread data samples, and the number can be determined by calculating the distance between write pointer 310 and read pointer 312.

Data from real-time sources which enters the queue is typically sampled according to an external, asynchronous clock source which may have a different rate and may drift relative to the audio system clock source. This results in an accumulation or depletion of unread data in the queues. Recall that Fc is defined to be the ratio of the input sample rate for a voice to the output sample rate. Hence, given a fixed output sample rate Fo, the input sample rate Fi is regulated by setting Fc=Fi/Fo. As the DSP operates to interpolate and re-sample the input voices, it maintains a Fc value for each asynchronous input voice. In the preferred embodiment, the Fc values are adjusted as described below to regulate the rates at which input samples are read from the queues. This permits a synchronization of asynchronous real-time input sources to a master clock according to the present invention.

Figure 5:
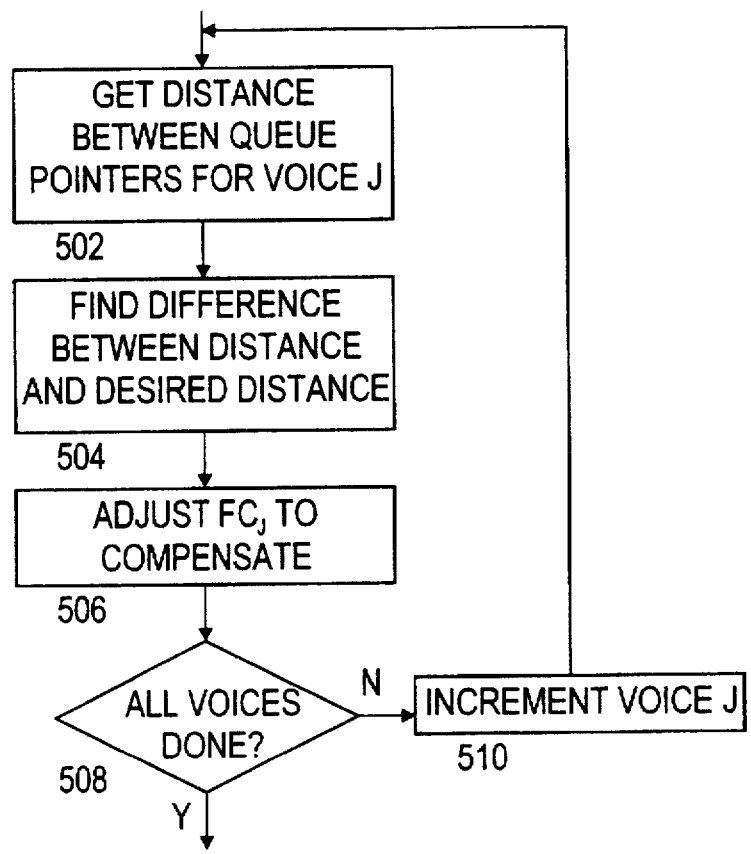
FIG. 5 is a flowchart illustrating some of the steps performed by the system audio device to maintain synchronization while mixing multiple voices to form a single audio output signal.

In a preferred embodiment, the CPU software includes an adjustment routine which periodically adjusts the Fc values. FIG. 5 is a flowchart illustrating steps executed to adjust the Fc values. Starting with the index j set to the first active asynchronous real-time voice, the CPU executes step 502 to determine the number of unread voice data samples stored in the queue for the current asynchronous real-time voice. In step 504, a difference between the number of unread samples and a predetermined "ideal" number of unread samples is found. In step 506, this difference is used to adjust the value of Fc in a manner discussed further below. In step 508, a check is made to determine whether the Fc values for all of the active asynchronous real-time voices have been updated. If not, index j is incremented in step 510, and control is returned to step 502. Otherwise, the adjustment routine is concluded, and the CPU returns to it at some future time.

An example of how Fc is adjusted is now provided. If both the input port and the output port are operating at 44.1 KHz sampling rates, and the queue capacity is 256 samples, then the optimal number of stored samples is 128. The software interrupt can be programmed to occur once every second. If Fc has a resolution of 0.1% and is initially set at 1.00000 (0.00080 too low), then the number of stored samples has decreased by 35 samples after the first second has elapsed. The CPU detects this and compensates by increasing Fc to 1.00100. At this point, Fc is too large, but this will help offset the increased number of stored samples. The table provided in FIG. 6 shows the time evolution of the system state. It is observed that the system operates as a software-controlled phase lock loop.

Numerous variations and modifications will become apparent to those skilled in the art once the above disclosure is fully appreciated. For example, various well-known algorithms may be applied to determine the adjustments to Fc. It is intended that the following claims be interpreted to embrace all such variations and modifications.

What is claimed is:

1. A digital audio source synchronizer comprising:
   a memory queue configured to receive and store data as the data is sampled at a first sampling rate, wherein said memory queue has a number of unread data samples; and
   a DSP coupled to retrieve stored data from said memory queue at a read rate, wherein said DSP generates interpolated data samples in response to said stored data and provides the interpolated data samples at a fixed sampling rate, wherein said read rate is periodically adjusted to substantially equal said first sampling rate by increasing the read rate when the number of unread data samples is determined to be less than a predetermined value and by decreasing the read rate when the number of unread data samples is determined to be greater the predetermined value.

2. The digital audio source synchronizer of claim 1, wherein said memory queue has a maximum capacity, and wherein said predetermined value is substantially half of the maximum capacity.

3. The digital audio source synchronizer of claim 1, wherein said DSP retrieves stored data from a plurality of memory queues, wherein each of said memory queues has a number of unread data samples which is used to adjust a corresponding read rate.

4. The digital audio source synchronizer of claim 1, wherein the interpolated data samples each include a weighted sum of samples from said memory queue.

5. A method of synchronizing first audio data sampled according to a first clock source with a different clock source having a fixed rate, the method comprising the steps of:
   receiving first audio data at a first rate;
   placing the first audio data in a queue, wherein said queue has a number of unread samples;
   retrieving unread data from the queue at a read rate, wherein said read rate is substantially equal to said first rate;
   comparing the number of unread samples to a predetermined value;
   increasing the read rate when the number of unread samples is less than said predetermined value;
   decreasing the read rate when the number of unread samples is greater than said predetermined value;
   interpolating first audio data at a sampling ratio determined by said read rate and said fixed rate to produce audio samples at the fixed rate.

6. The method of claim 5, wherein said first audio data is placed into the queue at a location specified by a write pointer, wherein said write pointer is advanced one position for each unread sample stored, wherein said unread sample is read from the queue at a location specified by a read pointer, wherein said read pointer is advanced one position for each unread sample retrieved.

7. The method of claim 6, further comprising the step of calculating the number of unread samples by comparing the write pointer to the read pointer.

8. The method of claim 5, wherein said comparing step is performed periodically.

9. The method of claim 5, wherein said queue has a maximum capacity, and wherein said predetermined value is substantially half of the maximum capacity.

10. A computer system comprising:
    a CPU;

an I/O bus for transmitting data;

a system memory coupled to said I/O bus for storing data, wherein the system memory stores data samples in a plurality of queues, wherein each of said queues has a number of unread data samples;

a system audio device comprising:

an I/O bus interface coupled to said I/O bus;

a DSP coupled to said I/O bus interface and configured to read said unread data samples from said queues at corresponding read rates, wherein each read rate is individually adjustable, wherein said DSP is configured to form a sequence of sums, wherein each sum comprises one interpolated sample from each of said queues, wherein said DSP is further configured to provide said sequence of sums at a fixed sample rate, and wherein said CPU is configured to periodically adjust each of said read rates to be substantially equal to corresponding sampling rates of data stored in each of said queues, wherein said adjustment is to increase the read rate when the number of unread data samples is determined to be less than a predetermined value and to decrease the read rate when the number of unread data samples is determined to the greater the predetermined value.

11. The computer system as recited in claim 10, wherein each of said queues has a maximum capacity, and wherein said predetermined value is substantially half of the maximum capacity.

12. The computer system as recited in claim 10, wherein said system audio device further comprises:

a read buffer coupled to said I/O bus interface for buffering said stored data samples from said system memory; and a buffer manager coupled to said I/O bus interface, said DSP, and said read buffer, for managing transfers of a plurality stored data samples from said system memory to said read buffer; wherein said stored data samples are transferred from said read buffer to said DSP in response to control signals from said DSP for said time-delay data samples.

13. The computer system as recited in claim 12, wherein each of said queues has a corresponding read buffer in said system audio device.

14. The computer system as recited in claim 12, wherein said buffer manager generates a normal fill signal to said I/O bus interface for requesting said I/O bus interface to generate a normal priority I/O bus mastership, and said buffer manager generates a high priority fill signal to said I/O bus interface for requesting said I/O interface to generate a high priority I/O bus mastership.

15. A digital audio source synchronizer comprising:

a plurality of memory queues each configured to receive and store respective data as the respective data is sampled at a respective first sampling rate, wherein each of said memory queues has a respective number of unread data samples; and a DSP coupled to retrieve stored data from each of said memory queues at a respective read rate, wherein said DSP generates a respective interpolated sample for each of said memory queues, wherein said respective interpolated sample comprises a weighted sum of the stored data from a corresponding one of said memory queues, wherein said DSP responsively provides a sum of the interpolated samples at a second sampling rate, wherein said respective read rate of each of said memory queues is periodically adjusted to substantially equal said respective first sampling rate by increasing the respective read rate when the respective number of unread data samples is determined to be less than a respective predetermined value and by decreasing the respective read rate when the respective number of unread data samples is determined to be greater the respective predetermined value.

* * * * *

UNITED STATES PATENT AND TRADEMARK OFFICE
CERTIFICATE OF CORRECTION

PATENT NO. : 5,761,434
DATED : June 2, 1998
INVENTOR(S) : Larry Hewitt

It is certified that error appears in the above-identified patent and that said Letters Patent is hereby corrected as shown below:

Claim 10, col. 7, lines 23 and 24 read "is determined to the greater the predetermined value."

Should read "is determined to be greater than the predetermined value."

Signed and Sealed this

First Day of September, 1998

Attest:

BRUCE LEHMAN

Attesting Officer

Commissioner of Patents and Trademarks